(12) United States Patent
McCollum (10) Patent No.: US 9,159,428 B2
(45) Date of Patent: Oct. 13, 2015

(54) AUTO-REFRESH METHOD FOR SONOS NON-VOLATILE MEMORY ARRAY

(71) Applicant: Microsemi SoC Corp., San Jose, CA (US)

(72) Inventor: John McCollum, Orem, UT (US)

(73) Assignee: Microsemi SoC Corporation, San Jose, CA (US)

( * ) Notice: Subject to any disclaimer, the term of this patent is extended or adjusted under 35 U.S.C. 154(b) by 225 days.

(21) Appl. No.: 14/013,339

(22) Filed: Aug. 29, 2013

(65) Prior Publication Data

US 2014/0078830 A1     Mar. 20, 2014

Related U.S. Application Data

(60) Provisional application No. 61/701,962, filed on Sep. 17, 2012.

(51) Int. Cl.
| | |
|---|---|
| *G11C 16/06* | (2006.01) |
| *G11C 16/10* | (2006.01) |
| *G11C 16/26* | (2006.01) |
| *G11C 16/04* | (2006.01) |
| *G11C 11/406* | (2006.01) |

(52) U.S. Cl.
CPC ............ *G11C 16/10* (2013.01); *G11C 16/0466* (2013.01); *G11C 16/26* (2013.01); *G11C 11/40607* (2013.01)

(58) Field of Classification Search
CPC .. G11C 16/10; G11C 16/16; G11C 11/40607; G11C 11/5628; G11C 13/0069; G11C 11/40618; G11C 11/4091; G11C 11/5635
USPC ............. 365/185.21, 185.25, 185.29, 185.18, 365/222
See application file for complete search history.

(56) References Cited

U.S. PATENT DOCUMENTS 7,894,270 B2 *   2/2011   Choi et al. ............... 365/185.25

* cited by examiner

*Primary Examiner* — David Lam
(74) *Attorney, Agent, or Firm* — Leech Tishman Fuscaldo & Lampl; Kenneth D'Alessandro, Esq.

(57) ABSTRACT

A method for performing auto-refresh of a SONOS memory in a field programmable gate array in a system, includes sensing an auto-refresh condition, selecting a memory segment that has not yet been refreshed, storing the contents of memory segment, erasing the memory cells in the memory segment, and reprogramming the memory cells in the memory segment, until all of the memory segments have been reprogrammed.

20 Claims, 4 Drawing Sheets

AUTO-REFRESH METHOD FOR SONOS NON-VOLATILE MEMORY ARRAY

BACKGROUND

Field of the Invention

The present invention relates to integrated circuits and to integrated circuit non-volatile memory arrays. More particularly, the present invention relates to SONOS memory arrays and specifically auto-refresh techniques for SONOS memory arrays, especially configuration memory arrays, for field programmable gate array (FPGA) integrated circuits.

BRIEF DESCRIPTION

A method is disclosed for performing auto-refresh of a Silicon-Oxide-Nitride-Oxide-Silicon (SONOS) memory array such as a configuration memory in a field programmable gate array (FPGA) in a system. Persons of ordinary skill in the art will recognize that, while the term FPGA is used throughout this disclosure, the present invention relates to all programmable logic devices that include internal SONOS configuration memory. The method includes sensing an auto-refresh condition, disabling the field programmable gate array, selecting a memory segment, storing the contents of the memory segment, erasing the memory cells in the memory segment, reprogramming the memory cells in the memory segment, and repeating the selecting, storing, erasing, and reprogramming until all of the memory segments have been reprogrammed. The field programmable gate array is then re-enabled. Circuitry for performing the method is also disclosed.

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
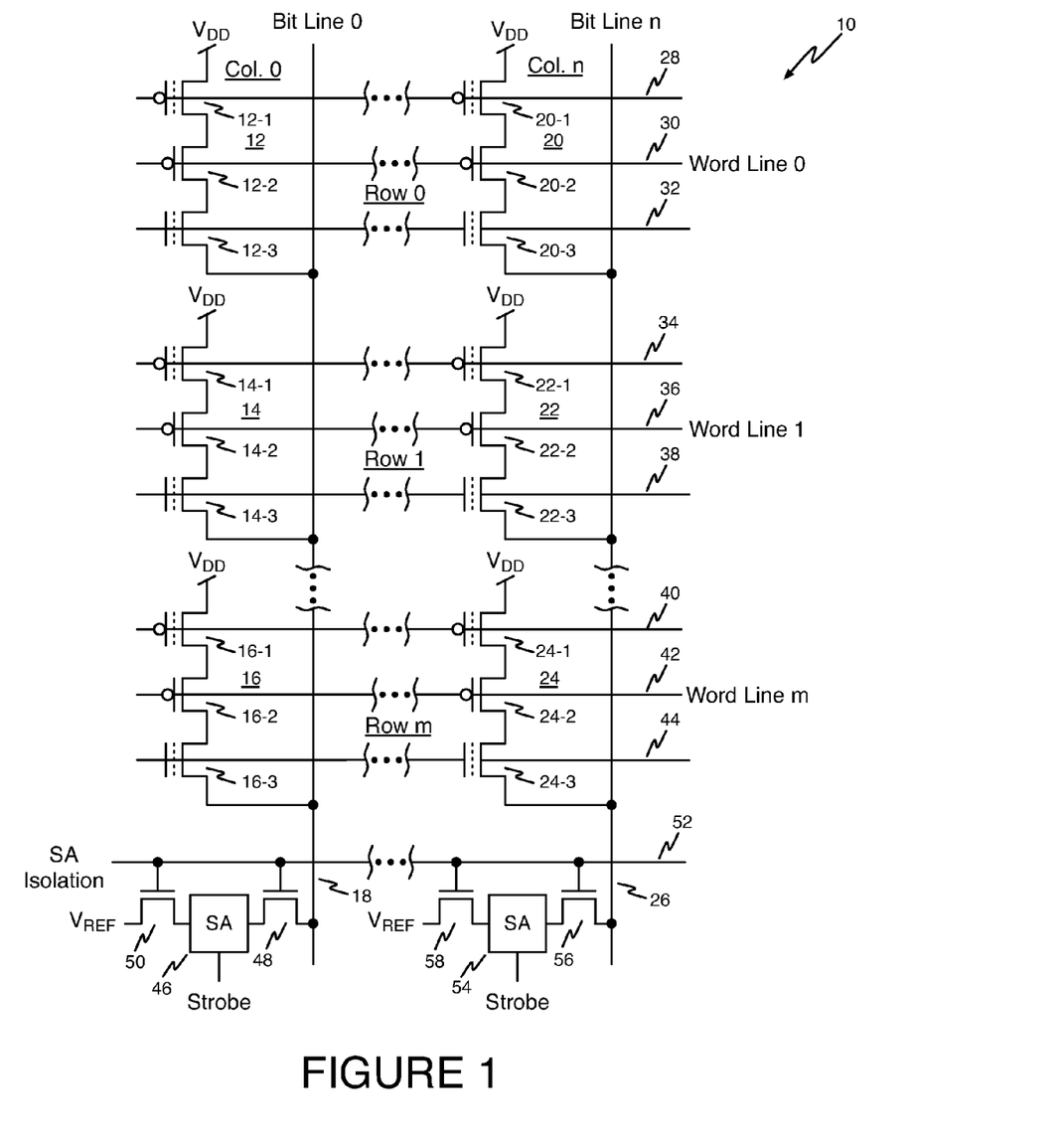
FIG. 1 is a diagram showing a portion of two columns of a portion of a segment in a SONOS non-volatile memory array according to the present invention.

Referring first to FIG. 1, a diagram shows a portion of two columns of a portion of a segment in a SONOS non-volatile memory array 10 according to the present invention. Segmentation of memories for reasons such as reducing bit line capacitance is well known in the art. SONOS non-volatile memory array 10 may be used as a configuration memory for an FPGA integrated circuit. In such an application, and each SONOS memory cell in the array 10 controls a switch that is selectively turned on or off to connect or not connect interconnect networks, or to define logic functions in the FPGA as is known in the art. Persons skilled in the art will understand that memory array 10 could also be bulk memory. A first column (column 0) of the array includes memory cells 12, 14, and 16. Memory cell 12 is disposed in a first row (row 0) of the array and includes p-channel SONOS transistor 12-1 in series with p-channel volatile transistor 12-2 and n-channel SONOS transistor 12-3. The SONOS transistors act as complementary memory transistors, and the p-channel volatile transistors function to protect the p-channel non-volatile transistors from decaying due to excessive $V_S$ during normal operation. During normal operation, the p-channel volatile transistors are operated in a source bias condition to limit the $V_{DS}$ across the non-volatile p-channel transistors that are turned off. During programming, the p-channel volatile transistors are operated as disclosed herein. Memory cell 14 is disposed in a second row (row 1) of the array and includes p-channel SONOS transistor 14-1 in series with p-channel volatile transistor 14-2 and n-channel SONOS transistor 14-3. Memory cell 16 is disposed in a last row (row m) of the array and includes p-channel SONOS transistor 16-1 in series with p-channel volatile transistor 16-2 and n-channel SONOS transistor 16-3. In each of cells 12, 14, and 16 the series transistors are coupled between $V_{DD}$ and column bit line 18.

A last column (column n) of the array includes memory cells 20, 22, and 24. Memory cell 20 is disposed in a first row (row 0) of the array and includes p-channel SONOS transistor 20-1 in series with p-channel volatile transistor 20-2 and n-channel SONOS transistor 20-3. Memory cell 22 is disposed in a second row (row 1) of the array and includes p-channel SONOS transistor 22-1 in series with p-channel volatile transistor 22-2 and n-channel SONOS transistor 22-3. Memory cell 24 is disposed in a last row (row m) of the array and includes p-channel SONOS transistor 24-1 in series with p-channel volatile transistor 24-2 and n-channel SONOS transistor 24-3. In each of cells 20, 22, and 24 the series transistors are coupled between $V_{DD}$ and column bit line 26.

P-channel word line 28 is coupled to the control gates of transistors 12-1 and 20-1 and is used for programming transistors 12-1 and 20-1 of row 0 of the array. P-channel row (Word Line 0) line 30 is coupled to the control gates of transistors 12-2 and 20-2 and is used for reading the contents of memory cells 12 and 20. N-channel word line 32 is coupled to the control gates of transistors 12-3 and 20-3 and is used for programming transistors 12-3 and 20-3. Similarly, p-channel word line 34 is coupled to the control gates of transistors 14-1 and 22-1 and is used for programming transistors 14-1 and 22-1 of row 1 of the array. P-channel row (Word Line 1) line 36 is coupled to the control gates of transistors 14-2 and 22-2 and is used for reading the contents of memory cells 14 and 22. N-channel word line 38 is coupled to the control gates of transistors 14-3 and 22-3 and is used for programming transistors 14-3 and 22-3. P-channel word line 40 is coupled to the control gates of transistors 16-1 and 24-1 and is used for programming transistors 16-1 and 24-1 in row n of the array. P-channel row (Word Line m) line 42 is coupled to the control gates of transistors 16-2 and 24-2 and is used for reading the contents of memory cells 16 and 24 of row m of the array. N-channel word line 44 is coupled to the control gates of transistors 16-3 and 24-3 and is used for programming transistors 16-3 and 24-3.

Column 0 bit line 18 is coupled to sense amplifier 46 through isolation transistor 48. Sense amplifier 46 is coupled to a reference voltage $V_{REF}$ through isolation transistor 50. The gates of isolation transistors 48 and 50 are controlled by SA isolation line 52. Similarly, column n bit line 26 is coupled to sense amplifier 54 through isolation transistor 56. Sense amplifier 54 is coupled to a reference voltage $V_{REF}$ through isolation transistor 58. The gates of isolation transistors 56 and 58 are controlled by SA isolation line 52. Isolation transistors 48, 50, 56, and 58 are turned off by asserting zero volts on SA isolation line 52 to isolate sense amplifiers 46 and 54 during auto-refresh cycles of memory array 10.

Persons of ordinary skill in the art will understand that, during normal operation of the SONOS memory array 10, P-channel word lines 28, 34, and 40 are coupled to $V_{DD}$, N-channel word lines 32, 38, and 44 are coupled to ground, and Word lines 30, 36, and 42 are coupled to ground. Thus, the SONOS memory transistors will only conduct responsive to charge stored on their respective charge trapping layers. Such persons of ordinary skill in the art will also appreciate that, during programming and erasing of the SONOS memory cells, depending on the architecture and programming mechanisms employed for the transistors used in the memory cells, different programming and erase potentials will be applied to the column bit lines 18 and 26, and to P-channel word lines 28, 34, and 40, N-channel word lines 32, 38, and 44, and word lines 30, 36, and 42. The present invention applies to all variations of SONOS memory cells and persons of ordinary skill in the art will readily be able to design particular programming and erase circuits to provide appropriate voltages to program and erase any particular configuration of SONOS memory cells in accordance with the teachings of the illustrative example of the present invention.

Figure 2:
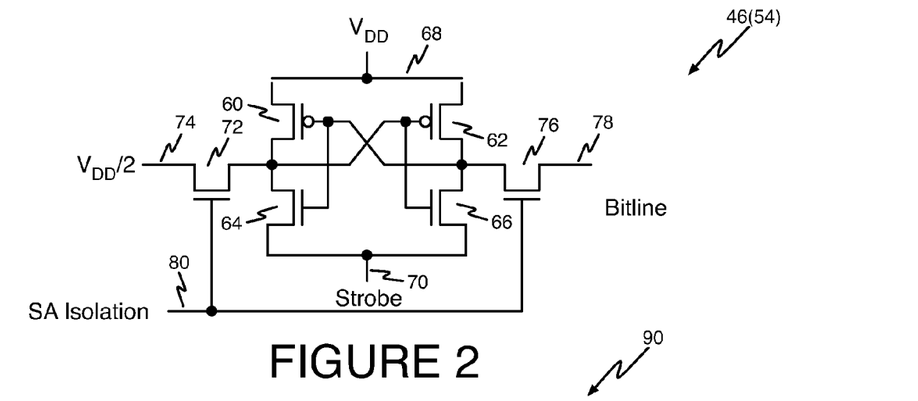
FIG. 2 is a diagram showing an exemplary sense amplifier circuit suitable for use in the present invention.

Referring now to FIG. 2, a diagram shows an exemplary sense amplifier circuit suitable for use as sense amplifiers 46 and 54 in the present invention. Persons of ordinary skill in the art will appreciate that the sense amplifier circuit shown in FIG. 2 is a non-limiting example, and that other sense amplifier circuits would function in the present invention. The sense amplifier of FIG. 2 is illustrated with the associated isolation transistors for ease of understanding.

Persons of ordinary skill in the art will recognize that the sense amplifier shown in FIG. 2 is a well-known cross-coupled latch circuit and includes p-channel transistors 60 and 62 and n-channel transistors 64 and 66. P-channel transistor 60 is connected in series with n-channel transistor 64 between $V_{DD}$ 68 and strobe line 70. P-channel transistor 62 is connected in series with n-channel transistor 66 between $V_{DD}$ 68 and strobe line 70. The gates of p-channel transistor 60 and n-channel transistor 64 are connected together to the common drain connection of p-channel transistor 62 and n-channel transistor 66. The gates of p-channel transistor 62 and n-channel transistor 66 are connected together to the common drain connection of p-channel transistor 60 and n-channel transistor 64.

The common drain connection of p-channel transistor 60 and n-channel transistor 64 is coupled through an n-channel isolation transistor 72 to a reference voltage 74 (shown as $V_{DD}/2$). The common drain connection of p-channel transistor 62 and n-channel transistor 66 is coupled through an n-channel isolation transistor 76 to a bit line 78. The gates of n-channel isolation transistors 72 and 76 are coupled to a sense amplifier isolation line 80. A high logic level at sense amplifier isolation line 80 connects the bit line and the reference voltage to the sense amplifier. A low logic level at strobe input 70 turns on the sense amplifier.

Initially, when the sense amplifier is turned on, 90 the common drain connection of transistors 60 and 64 is at a potential of $V_{DD}/2$ as are the gates of both transistors 62 and 66. The voltage $V_{DD}/2$ is selected because it is midway between the logic high and logic low states of the memory, thus minimizing the time it takes for the sense amplifier to latch in either logic state. A high or low voltage from the output of the selected memory cell on bit line 78 through transistor 76 will be presented to the common drain connection of transistors 62 and 66 and to the gates of both transistors 62 and 66, causing one of transistors 60 and 64 to be turned off. This action will either pull the common drain connection of transistors 60 and 64 up to $V_{DD}$ or pull it down to ground, easily overpowering the reference voltage through a weaker transistor 72. Regenerative feedback from the common drain connection of transistors 60 and 64 to the gates of transistors 62 and 66 will latch the sense amplifier (and the bit line to which it coupled) to the voltage level representing the bit value stored in the memory cell. A low logic level at sense amplifier isolation line 80 disconnects the bit line and maintains the stored value. A high logic level at strobe 70 clears the sense amplifier.

Figure 3:
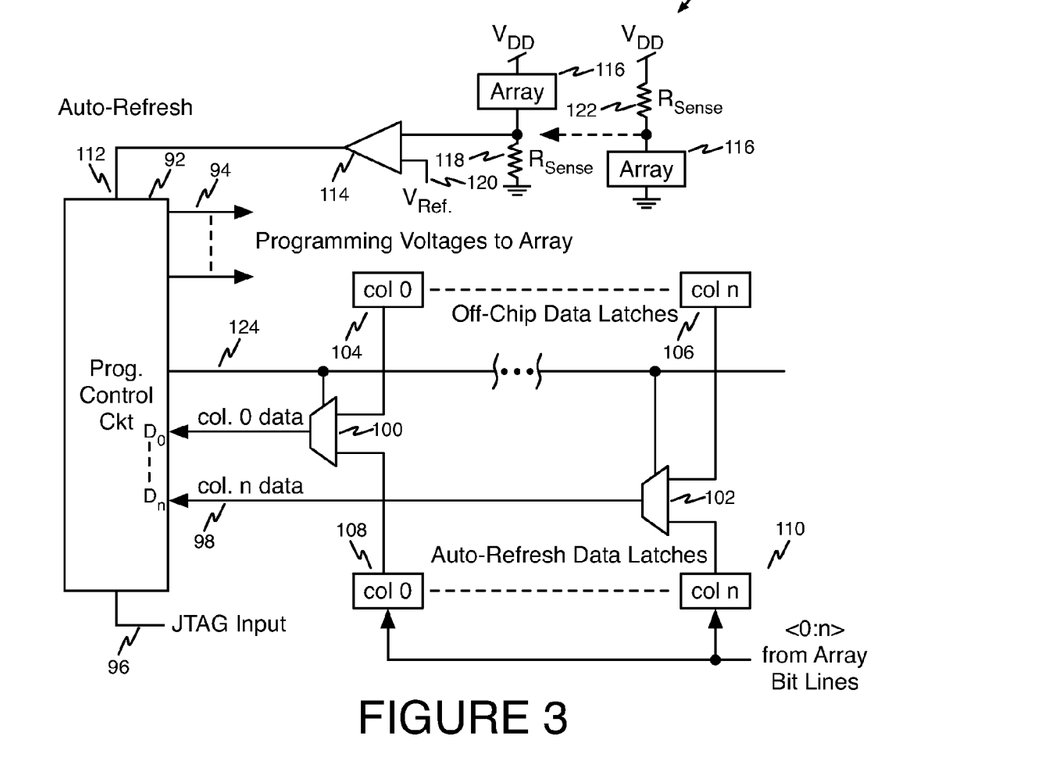
FIG. 3 is a diagram of an illustrative circuit for implementing an auto-refresh cycle in a SONOS non-volatile memory array according to the present invention.

Referring now to FIG. 3, an illustrative circuit 90 for implementing an auto-refresh cycle in a SONOS non-volatile memory array according to the present invention. The circuit of FIG. 3 is a non-limiting example of a circuit that may be used for this purpose although persons of ordinary skill in the art will appreciate that other circuits that perform the functions described herein could be used.

Programming control circuit 92 includes the circuitry necessary for programming and erasing a SONOS memory array, such as charge pumps, address decoders, and high-voltage circuits as well as control circuitry to control the timing of the operation of the charge pumps, address decoders, and high-voltage circuits to accomplish programming and erasing of SONOS memory cells. Programming and erase circuits of this kind are well known in the memory art and will not be described herein in detail in order to avoid unnecessarily overcomplicating the disclosure. Programming control circuit 92 generates programming control signals, address information, and programming and erase voltages to the memory array on lines 94. Programming control circuit 92 preferably includes a state machine or microcontroller to direct its operations as is known in the art.

Programming control circuit 92 preferably includes JTAG input 96 from which off-chip programming commands are received. Program data inputs 98 to programming control circuit 92 are fed by program data multiplexers 100 and 102. Program data multiplexers 100 and 102 are provided to select between data provided from off-chip in off-chip data latches 104 and 106 and auto-refresh data provided from auto-refresh data latches 108 and 110. Off-chip data latches 104 and 106 can be any kind of temporary storage and are used to temporarily store data provided from off chip to program the SONOS memory array as is well known in the art. Auto-refresh data latches 108 and 110 can be the sense amplifiers shown in FIG. 1 and FIG. 2 or can be separate temporary storage locations coupled to the SONOS memory array and are used to temporarily hold data read from the SONOS memory cells when an auto-refresh cycle of the SONOS memory array is performed according to the present invention. Persons of ordinary skill in the art will realize that, while only two multiplexers and data latch sets are shown, the diagram represents an n-bit wide circuit and may include an arbitrary number of data bits depending on the particular design.

Programming control circuit 92 also includes auto-refresh input 112. Auto-refresh input 112 signals the programming control circuit 92 that the SONOS memory array needs to be refreshed in accordance with the present invention. When a push-pull SONOS memory cell like the one shown in FIG. 1 is programmed, one of its memory transistors is turned on and the other memory transistor remains turned off. Immediately after programming, a SONOS memory cell has a leakage current (through the one of the SONOS transistors that is turned off) that is typically in the order of a few picoamperes. The leakage current through the entire SONOS memory array is equal to the leakage current of an individual cell multiplied by the number of cells in the array. A medium sized SONOS configuration array in an FPGA integrated circuit can include 100 megabits. Over time, the leakage current through the turned-off one of the SONOS transistors in each of the SONOS memory cells (and therefore the total array current) increases as conduction through the off transistors in the individual memory cells increases. The total current through the SONOS memory array can reach an unacceptably large value long before leakage current in the turned-off SONOS transistors in the memory cells in the array becomes so large as to indicate that the memory cells are in danger of losing their data. The designer responsible for chip power management will typically specify a maximum total array current level beyond which the SONOS memory array needs to be refreshed.

Auto-refresh input 112 is driven by an auto-refresh condition sensing circuit such as comparator 114. In the particular embodiment shown in FIG. 3, comparator 114 compares the array current in the ground leg of the power supply to array 116 through sense resistor 118 with a reference 120. Alternatively, as shown in FIG. 3, comparator 114 compares the array current in the $V_{DD}$ leg of the power supply to array 116 through sense resistor 122 with reference 120. In either case, when the array current equals or exceeds the reference value, indicating current leakage in the SONOS memory cells in the array exceeding a design value, this is an indication that the SONOS memory array 116 needs to be refreshed. Comparator 114 changes state upon sensing an auto-refresh condition. Programming control circuit 92 responds by initiating an auto-refresh cycle. The auto-refresh cycle can be implemented by the state machine or microcontroller in programming control circuit 92. Programming control circuit 92 asserts a signal on line 124, coupled to the select inputs of multiplexers 100 and 102, thus providing programming data read from the memory array and stored in auto-refresh data latches 108-110 to the programming control circuit 92 instead of programming data brought from off chip and stored in another set of latches 104-106.

Figure 4:
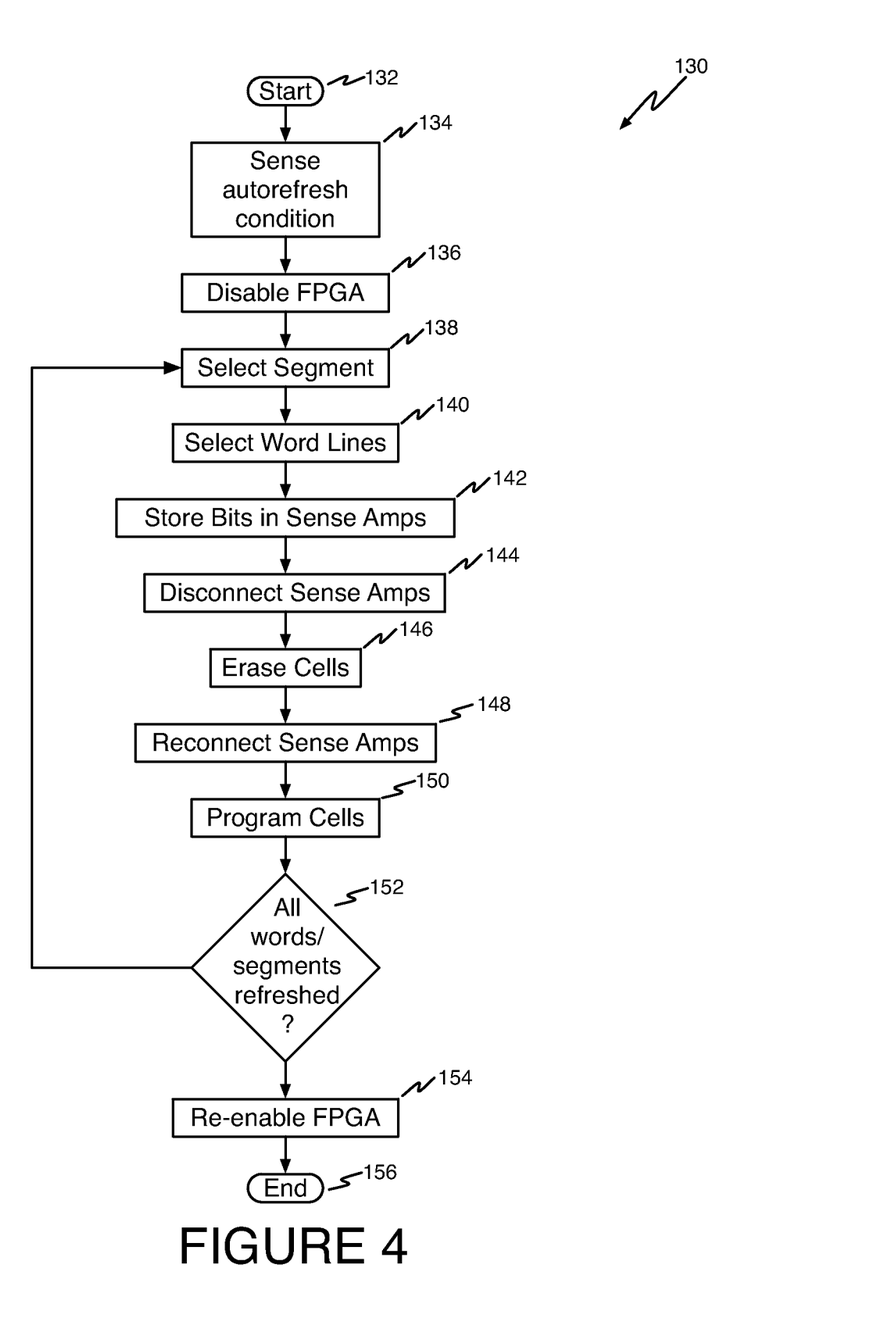
FIG. 4 is a flow diagram showing an illustrative process for performing auto-refresh of a SONOS memory array in accordance with the present invention.

Referring now to FIG. 4, a flow diagram shows an illustrative process 130 for performing auto-refresh of a SONOS memory array in accordance with the present invention. The process begins at reference numeral 132. First, at reference numeral 134, an auto-refresh condition is sensed. Since SONOS cells tend to follow a general chip wide discharge rate it is possible to have a circuit monitor the SONOS cell state of charge. There are several ways to do this. One illustrative way is to use the above-described leakage of the push-pull cell by monitoring the array current as disclosed with reference to FIG. 3. As will be appreciated by persons of ordinary skill in the art, this may be done by passing the ground or $V_{DD}$ current though a small resistor and detecting a critical voltage across it using a level detector as shown in FIG. 3.

Once the need to refresh is detected an output pin can be asserted indicating to the system containing the FPGA that refresh is needed at the next maintenance cycle. The auto-refresh would then begin on acknowledgement from the system from a JTAG or other input to the integrated circuit containing the SONOS memory array. Upon such acknowledgement, the FPGA can be disabled as is well known in the art at reference numeral 136. As will be immediately understood by persons of ordinary skill in the art, because the SONOS memory is used to control switches that configure and define the programmable circuits within the FPGA, the FPGA is disabled during auto-refresh cycles in order to prevent unknown and uncontrollable states of the control switches from causing malfunction or damage to the circuitry or system controlled by the FPGA. This does not present a problem in operating the system containing the FPGA because an auto-refresh cycle will typically be called during a power-up cycle of the FPGA system, when the FPGA is off line anyway.

According to one illustrative example, one method of reading and writing back the data stored in the FPGA configuration is disclosed. Those skilled in the art of NVM memories will recognize that there are methods of reading and erasing and programming specific NVM memories using the same or other voltages depending on the particular SONOS technologies and geometries encountered. Such skilled persons are well versed in the processes for erasing and programming SONOS memory arrays.

At reference numeral 138, a memory segment is selected using the address decoder circuitry as is well known in the art. The bit line for each memory cell in the segment is pre-charged to 0V and released by the address decoding circuitry. At reference numeral 140 a selected row in the segment is enabled using the address decoder circuitry as is well known in the art. The P-Channel word line is grounded to guarantee that the P-Channel SONOS transistor is turned on. The N-Channel word line is left at 0V. Because the N-Channel word line is at 0V, the corresponding N-Channel SONOS transistor will pull up the floating bit line above ground only if it is turned on by charge stored on its floating gate. The state of the SONOS memory cell can thus be determined by sensing whether the N-Channel SONOS transistor in the cell is turned on or off. If the P-channel SONOS transistor is turned on and the N-Channel SONOS transistor is turned off, the memory cell is on (meaning that an N-Channel switch transistor (not shown) having its gate coupled to the common drain connection of the p-channel volatile transistor and n-channel SONOS transistor in any one of the cells shown in FIG. 1 will be turned on); if the P-channel SONOS transistor is turned off and the N-Channel SONOS transistor is turned on, the memory cell is off (meaning that the N-Channel switch transistor (not shown) having its gate coupled to the common drain connection of the p-channel volatile transistor and n-channel SONOS transistor in any one of the cells shown in FIG. 1 will be turned off). At reference numeral 142 the state of the memory cell selected by the word lines and sensed on the bit line is stored in the latched sense amplifiers. In a typical array, the SA isolation line 80 is clocked about 100 ns after the selected word line is grounded then the strobe input of the sense amplifier is clocked to store the data indicating whether the memory cell is on or off (i.e., which of the N-Channel and P-Channel SONOS transistors is on). Next, at reference numeral 144, the sense amplifiers are disconnected from the bit lines by de-asserting the SA isolation line 80. The state of the memory cell is now stored in the latch of the sense amplifier.

At reference numeral 146, the memory cells in the selected row are erased using conventional techniques for erasing SONOS memory cells. This results in both the N-Channel and the P-Channel SONOS transistors in the cells being turned on. Next, at reference numeral 148, the sense amplifiers are reconnected to the bit lines by asserting the SA isolation line, the bit values of the cells in the row to be refreshed are written into the level shifters and the cells in the selected row are then reprogrammed at reference numeral 150 by programming (turning off) the appropriate one of the N-Channel and P-Channel SONOS transistors using conventional techniques for programming SONOS memory cells. In one illustrative embodiment of the invention, both the P-channel word line and the N-Channel word line are driven by address decoder circuits to appropriate programming voltages (e.g., 7.5V for the N-Channel SONOS device and −3.9V for the P-channel SONOS device) and, depending on the voltage level on the bit line representing the data to be programmed, only one of the SONOS devices will have a sufficient voltage across it to enable the programming mechanism such as tunneling to occur. As will be appreciated by persons of ordinary skill in the art, the actual programming sequence and applied voltages will be determined by the particular SONOS technologies and geometries encountered.

At reference numeral 152 it is determined whether all words and all segments have been refreshed. If not, the process returns to reference numeral 138, where another word (or a first word in another segment) of the memory array is selected. If all segments have been refreshed, the process proceeds to reference numeral 154, where the FPGA is re-enabled. The process ends at reference numeral 156.

Figure 5:
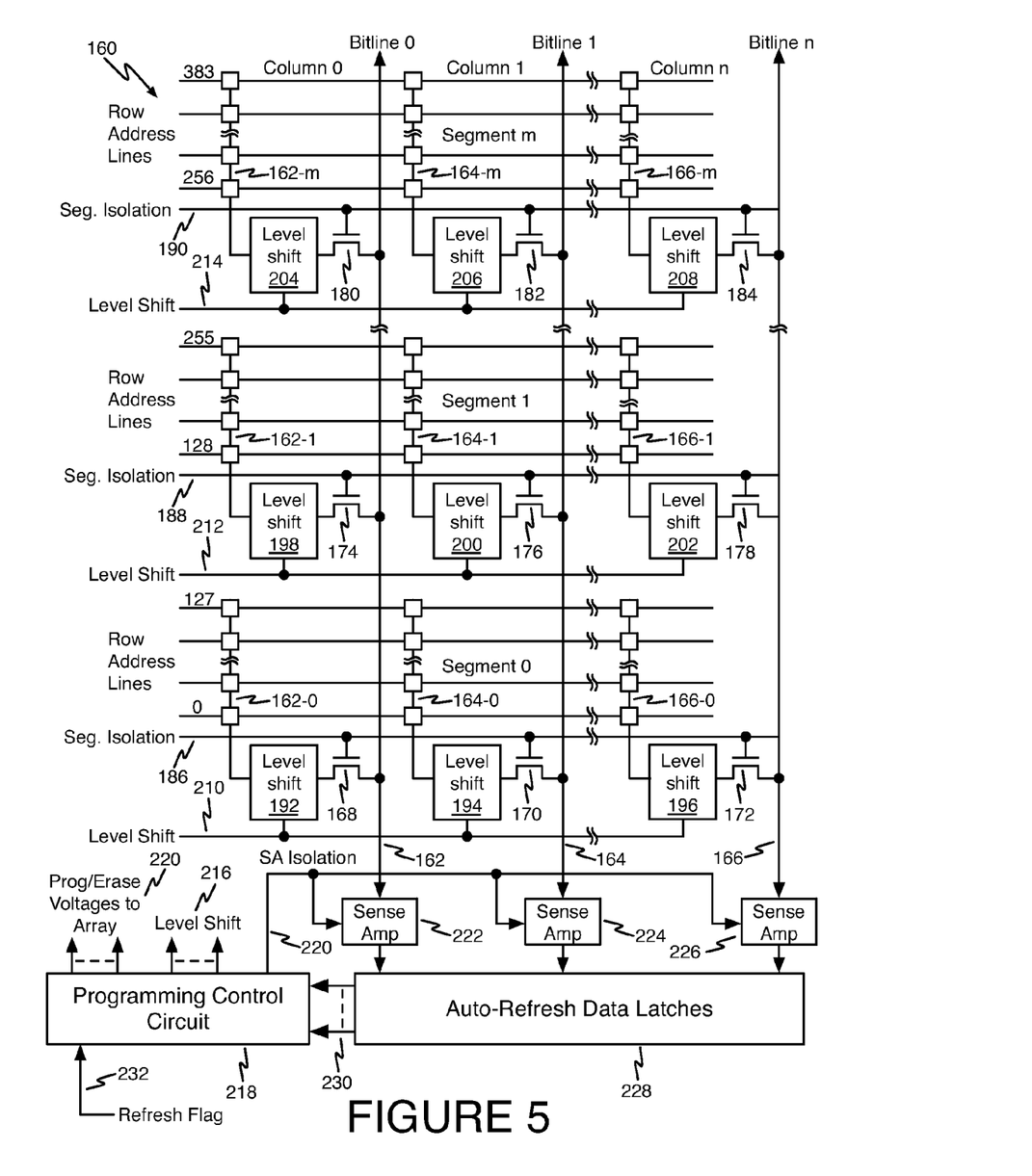
FIG. 5 is a diagram showing a portion of three columns of multiple segments in an illustrative SONOS non-volatile memory array according to the present invention.

Referring now to FIG. 5, a diagram shows a portion of three columns of multiple segments in an illustrative SONOS non-volatile memory array 160 according to the present invention. Column 0 is coupled to bit line 162, column 1 is coupled to bit line 164, and column n is coupled to bit line 166.

The bitlines 162, 164, and 166 are segmented as will be appreciated by persons of ordinary skill in the art. Segment 0 of the array includes rows 0-127 and includes bit line segments 162-0, 164-0 and 166-0. Segment 1 of the array includes rows 128-255 and includes bit line segments 162-1, 164-1 and 166-1. Segment n of the array includes rows 256-383 and includes bit line segments 162-$n$, 164-$n$ and 166-$n$. Each cell in the array (shown in FIG. 5 as small squares at the intersections of bit line segments and row address lines) is coupled to its associated bit line segment as is known in the art.

Bit line segments 162-0, 164-0 and 166-0 may be isolated from bit lines 162, 164, and 166, respectively by segment isolation transistors 168, 170, and 172, respectively. Bit line segments 162-1, 164-1 and 166-1 may be isolated from bit lines 162, 164, and 166, respectively by segment isolation transistors 174, 176, and 178, respectively. Bit line segments 162-$n$, 164-$n$ and 166-$n$ may be isolated from bit lines 162, 164, and 166, respectively by segment isolation transistors 180, 182, and 184, respectively. Segment isolation transistors 168, 170, and 172, associated with segment 0 of the array, are controlled from segment isolation line 186. Segment isolation transistors 174, 176, and 178, associated with segment 1 of the array, are controlled from segment isolation line 188. Segment isolation transistors 180, 182, and 184, associated with segment n of the array, are controlled from segment isolation line 190.

Bit line segments 162-0, 164-0 and 166-0 are coupled to segment isolation transistors 168, 170, and 172 through level shifter circuits 192, 194, and 196, respectively. Bit line segments 162-1, 164-1 and 166-1 are coupled to segment isolation transistors 174, 176, and 178 through level shifter circuits 198, 200, and 202, respectively. Bit line segments 162-$n$, 164-$n$ and 166-$n$ are coupled to segment isolation transistors 180, 182, and 184 through level shifter circuits 204, 206, and 208, respectively. Level shifter circuits in segment 0 are controlled by level shift line 210; level shifter circuits in segment 1 are controlled by level shift line 212; level shifter circuits in segment n are controlled by level shift line 214.

During normal operation, the level-shifter circuits provide the cell data to the bit lines through the bit line isolation transistors. During programming and erase operations, the level-shifter circuits are used to provide the voltages necessary for programming and erasing the memory cells. Level shift lines 210, 212, and 214 are controlled by outputs 216 from programming control circuit 218. Programming control circuit 218 also generates output voltages on program/erase control lines 220 to drive the bit lines and row address lines in the various segments of the array to the proper voltages necessary to program and erase the SONOS memory cells. Persons of ordinary skill in the art will appreciate that row address lines include row lines for both the P-Channel and N-channel memory transistors, as well as the P-channel volatile transistor. As previously noted, these voltages will vary depending on the particular design of the SONOS memory cells used in the array. Specifying a specific level-shifter circuit for the needs of a particular SONOS memory technology is a routing exercise for a person of ordinary skill in the art. Programming control circuit 218 also provides the signals to SA isolation control lines to control the isolation transistors in sense amplifiers 222, 224, and 226.

The bit lines 162, 164, and 166 are also coupled to auto-refresh data latches 228. Data stored in the auto-refresh data latches 228 are provided to programming control circuit 218 to provide programming control circuit 218 with the refresh data to be written into the SONOS memory cells.

The auto-refresh procedure of the present invention has a low overhead. Since SONOS erasing is as fast as programming (e.g., about 10 mS), the data in each row or block can be read out by the normal verify procedure, which comprises reading the contents of the memory cell after completing the write operation. As will be appreciated by persons of ordinary skill in the art, verification can be performed immediately following the write operation or after all of the memory cells have been programmed. The sense amplifiers shown in FIGS. 1 and 2 then hold the data either directly or transfer the data to an associated auto-refresh data latch or SRAM cell as seen in FIG. 3 while the row or block is erased by the programming control circuit 218. The data are then re-written into the memory cells under the control of the programming control circuit 218. This process will take 20 to 40 mS/row or about 1 to 2 minutes for a large part.

Because the bit lines in arrays like the SONOS memory arrays discussed herein are usually segmented as is well known in the art to minimize column disturb, the bit line capacitance is small. This means that a simple sense amplifier that does not have to be designed to drive a large capacitive load can be associated with each segment. This allows for parallel refresh and programming, thus reducing the refresh time a hundred fold. The auto-refresh scheme of the present invention has an additional advantage in that a dedicated capacitor supplying the programming voltages (usually connected at the power supply terminals of the chip) can be used to prevent a power failure causing an interruption of the refresh cycle. Alternatively, an NVM row counter can be used to verify the count so it can resume where it left off at the restoration of power.

Persons of ordinary skill in the art will appreciate that when reading p-channel transistors, n-channel transistors are biased on and that when reading n-channel transistors, p-channel transistors are biased on. Such persons of ordinary skill in the art will also realize that a second port could be added to each sense amplifier to read/write data to outside the integrated circuit.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a memory array disposed in a system, the memory array including a plurality of memory cells having a uniform charge-loss rate, a method for performing auto-refresh of the memory array the method comprising:
   a) sensing an auto-refresh condition;
   b) selecting a memory segment of the memory array, the memory segment including a plurality of memory cells that have not been refreshed;
   c) storing the contents of the memory cells from the memory segment;
   d) erasing the memory cells in the memory segment;
   e) reprogramming the memory cells in the memory segment with the stored contents of the memory cells; and
   f) repeating b) through e) until all of the memory segments have been reprogrammed.

2. The method of claim 1 further comprising:
   disabling the field programmable gate array after sensing an auto-refresh condition and before selecting a memory segment of the memory array; and
   re-enabling the field programmable gate array after all of the memory segments have been reprogrammed.

3. The method of claim 1 further comprising:
   sending an auto-refresh condition sensed signal to the system;
   receiving an auto-refresh command from the system; and
   disabling the field programmable gate array in response to the auto-refresh command from the system.

4. The method of claim 1 wherein sensing an auto-refresh condition comprises monitoring the state of charge of the memory cells.

5. The method of claim 4 wherein monitoring the state of charge of the memory cells comprises;
   monitoring current flowing in the array to determine leakage in the SONOS memory cells; and
   comparing the monitored array current to a predetermined threshold.

6. The method of claim 5 wherein monitoring current flowing in the array comprises passing one of ground current and $V_{DD}$ current of the memory array though a resistor to develop a monitoring voltage.

7. The method of claim 1, wherein the memory array is a Silicon-Oxide-Nitride-Oxide-Silicon (SONOS) memory.

8. The method of claim 1, wherein said storing of the contents of the memory cells from the memory segment is in a sense amplifier associated with the memory segment.

9. A method for performing auto-refresh of a Silicon-Oxide-Nitride-Oxide-Silicon (SONOS) memory array in a field programmable gate array in a system, the method comprising:
   a) sensing an auto-refresh condition;
   b) selecting a memory segment of the SONOS memory array including a plurality of memory cells that have not been refreshed;
   c) storing the contents of the memory cells in the memory segment in sense amplifiers;
   d) disconnecting the sense amplifiers from the memory array;
   e) erasing the memory cells in the memory segment;
   f) reconnecting the sense amplifiers to the memory array;
   g) reprogramming the memory cells in the memory segment; and
   h) repeating b) through g) until all of the memory segments have been reprogrammed.

10. The method of claim 9 further comprising:
    disabling the field programmable gate array after sensing an auto-refresh condition and before selecting a memory segment of the SONOS memory array; and
    re-enabling the field programmable gate array after all of the memory segments have been reprogrammed.

11. The method of claim 9 further comprising:
    sending an auto-refresh condition sensed signal to the system;
    receiving an auto-refresh command from the system; and
    disabling the field programmable gate array in response to the auto-refresh command from the system.

12. The method of claim 9 wherein sensing an auto-refresh condition comprises monitoring the state of charge of the memory cells.

13. The method of claim 12 wherein monitoring the state of charge of the memory cells comprises;
    monitoring the array current; and
    comparing the monitored array current to a predetermined threshold.

14. The method of claim 13 wherein monitoring the array current comprises passing one of ground current and $V_{DD}$ current of the memory array though a resistor to develop a monitoring voltage.

15. The method of claim 14 wherein comparing the monitored array current to a predetermined threshold comprises comparing the monitoring voltage to a predetermined voltage threshold.

16. The method of claim 12 wherein monitoring the state of charge of the memory cells comprises monitoring the threshold voltage in a reference circuit.

17. An auto-refresh circuit for a memory array comprising:
    a sensing circuit coupled to the memory array for generating an auto-refresh signal in response to a predetermined condition of memory cells in the memory array;
    a program and erase circuit coupled to the memory array and configured to provide addressing signals and programming and erase potentials to memory cells in the memory array to erase the memory cells in the array and program the memory cells in the array with data supplied from off-chip;
    wherein the program and erase circuit is further coupled to the sensing circuit and responsive to the auto-refresh signal to refresh the data in the memory array by temporarily storing data from the memory cells, erasing the data in the memory cells, and re-programming the SONOS memory cells with the temporarily stored data.

18. The auto-refresh circuit of claim 17 wherein the memory array is organized into segments, and wherein the program and erase circuit is configured to select a segment of the memory array, temporarily store data from memory cells in the selected segment of the memory array, erase the data in the memory cells in the selected segment, and re-program the memory cells in the selected segment with the temporarily stored data.

19. The auto-refresh circuit of claim 17, wherein the memory array is a Silicon-Oxide-Nitride-Oxide-Silicon (SONOS) memory array, having associated sense amplifiers, and wherein temporarily stored data is stored in the associated sense amplifiers.

20. In an integrated circuit, apparatus for performing an auto-refresh operation on a memory array comprising:
    temporary data storage coupled to the memory array; and
    an auto-refresh condition sensing circuit coupled to the memory array and configured to sense an auto-refresh condition responsive to an electrical condition of the memory array and generate an auto-refresh condition signal; and a programming control circuit coupled to the memory array and configured to erase and program memory cells in the memory array, the programming control circuit further configured to receive the auto-refresh condition signal and in response store the contents of the memory array in the temporary data storage, erase the memory array, and reprogram the memory array from the temporary data storage.

* * * * *